United States Patent [19]
Cricchi

[11] 4,090,258
[45] May 16, 1978

[54] MNOS NON-VOLATILE MEMORY WITH WRITE CYCLE SUPPRESSION

[75] Inventor: James R. Cricchi, Catonsville, Md.

[73] Assignee: Westinghouse Electric Corp., Pittsburgh, Pa.

[21] Appl. No.: 755,280

[22] Filed: Dec. 29, 1976

[51] Int. Cl.² .................. G11C 7/00; G11C 11/40
[52] U.S. Cl. .................................. 365/184; 365/195
[58] Field of Search .................. 340/173 R, 173 CC; 307/238

[56] References Cited
U.S. PATENT DOCUMENTS

| | | | |
|---|---|---|---|
| 3,579,204 | 5/1971 | Lincoln | 340/173 R |
| 3,801,965 | 4/1974 | Keller et al. | 340/173 R |
| 3,836,894 | 9/1974 | Cricchi | 340/173 R |
| 3,936,811 | 2/1976 | Horninger | 340/173 R |

*Primary Examiner*—Stuart N. Hecker
*Assistant Examiner*—Donald McElheny, Jr.
*Attorney, Agent, or Firm*—R. M. Trepp

[57] ABSTRACT

An improved memory for storing digital data is described incorporating two variable threshold transistors per memory cell which are written in opposite directions concomitantly by applying a polarizing voltage across the gate insulator of each transistor. Subsequent writing into the memory cell is limited by means of sensing the data stored and comparing it with the data to be written to permit only write cycles where the data stored would be opposite. The variable threshold transistors are thereby operated out of saturation by shifting the voltage thresholds back and forth in opposite directions. By utilizing two variable threshold devices per memory cell, data is sensed by the difference in the conductance of the two devices providing a wider detection window.

9 Claims, 14 Drawing Figures

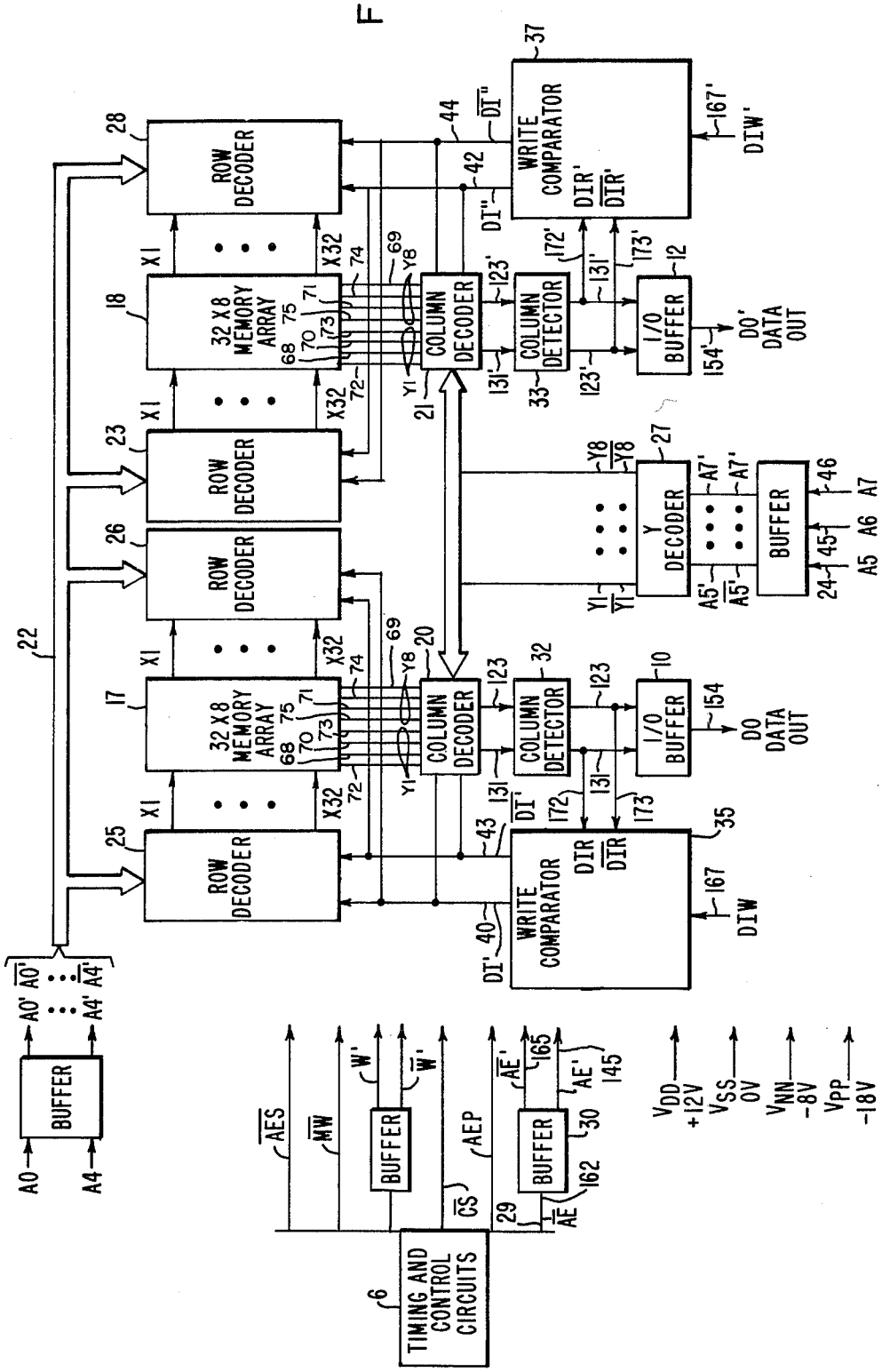

MNOS NON-VOLATILE MEMORY WITH WRITE CYCLE SUPPRESSION

GOVERNMENT CONTRACT

The invention herein described was made in the course of or under a contract or subcontract thereunder with the Department of the Air Force.

BACKGROUND OF THE INVENTION

1. Field of the Invention

This invention relates to semiconductor memories, particularly to non-volatile memories using variable threshold transistors.

2. Description of the Prior Art

In certain non-volatile memory applications it is desirable to have a short write cycle time to enable fast writing into the memory as well as reading out. One application suitable for a high speed write cycle memory is a scratch pad memory used for temporary storage of data in a computer. Memories utilizing variable threshold devices such as metal nitride oxide semiconductor (MNOS) transistors have been previously described such as in U.S. Pat. No. 3,836,894 which was issued on Sept. 17, 1974, entitled "MNOS/SOS Random Access Memory," invented by the inventor herein and assigned to the assignee herein. Information or data in a memory cell of a typical prior art MNOS memory was cleared or written to a low threshold or binary one state first regardless of the data in the memory cell. Secondly, selected memory cells were written to the high threshold or binary zero level. The write cycle for writing ones and then zeros into a memory cell is more than twice the minimum write pulse width.

In an MNOS memory of the prior art, data may be rewritten into the memory over and over. In other words, the memory cell may be written as a binary one for a number of times in a row before a binary zero is written. This causes the variable threshold transistor to shift its threshold to the maximum extent under the writing conditions called the saturated threshold state. When it is desired to write a binary level of the opposite state into the memory cell, the single write pulse must have adequate polarizing voltage and time to shift the threshold voltage of the transistor from the previous saturated state, for example minus 2 volts, to an opposite unsaturated state such as minus 5 volts. The typical write duration time to shift the threshold of an MNOS transistor from a saturated state representative of a first binary level to the second binary level for example 3 volts, is typically 2 to 3 microseconds. This means the minimum write cycle time for a MNOS memory of the prior art is limited to 4 to 6 microseconds.

In order to speed up the time of writing a binary level or shifting the voltage in a variable threshold transistor such as an MNOS transistor, the voltage or electric field across the gate insulator is increased by increasing the polarization voltage. Unfortunately, high electric fields across the gate insulator of a variable threshold device during the write cycle accelerates the undesirable endurance phenomena such as a smaller threshold voltage window and decreased retention time. The endurance phenomena of MNOS transistors runs counter to the requirement for a memory transistor that can withstand a large number of write cycles in typical random access memory applications.

In copending application Ser. No. 700,235, filed June 28, 1976 (W. E. Case 46,472), there is described a dual-mode memory system wherein the threshold of a dual gate MNOS memory transistor may be sensed by comparing the conductivity of a memory transistor in an array with the conductivity of a reference transistor. Alternately the memory transistor may be sensed by comparing the conductivity of the memory transistor in an array of transistors with the conductivity of another memory transistor in the array for each transistor. In place of comparing the conductivities of the memory transistors, the threshold voltages may be compared.

It is therefore desirable to have a variable threshold transistor memory which eliminates the clear or write cycle now required to write binary ones before writing zeros in selected memory cells. This would allow the shortest write cycle time since the data would be written into the memory cell directly during one write cycle.

It is furthermore desirable to minimize the number of write cycles experienced by the memory cells when the memory cells are utilized as a scratch pad memory to reduce the exposure of high electric fields to the gate insulator of the variable threshold transistors to retard the onset of endurance phenomena.

It is furthermore desirable to limit rewriting of the same data into the same memory cell over and over which drives the variable threshold device into threshold saturation.

SUMMARY OF THE INVENTION

In accordance with the present invention, a method and apparatus is provided for storing information comprising first and second variable threshold field effect transistors, first means for varying a threshold voltage of the first variable threshold transistor, second means for varying the threshold voltage of the second variable threshold transistor concomitantly with the first means, wherein the first means includes a means for increasing the threshold voltage and the second means includes a means for reducing the threshold voltage. The present invention further provides a method for writing data into a semiconductor memory utilizing variable threshold transistors comprising the steps of holding the input write data to be written into a memory cell, reading the data presently stored in the memory cell, comparing the input write data with the read data to generate a first signal indicative of the data being the same and a second signal indicative of the data being different, inhibiting the write cycle in response to the first signal, and writing the data into the memory cell in response to the second signal.

BRIEF DESCRIPTION OF THE DRAWINGS

FIG. 2 is a block diagram of one embodiment of the invention;

DESCRIPTION OF THE PREFERRED EMBODIMENTS

Figure 1:
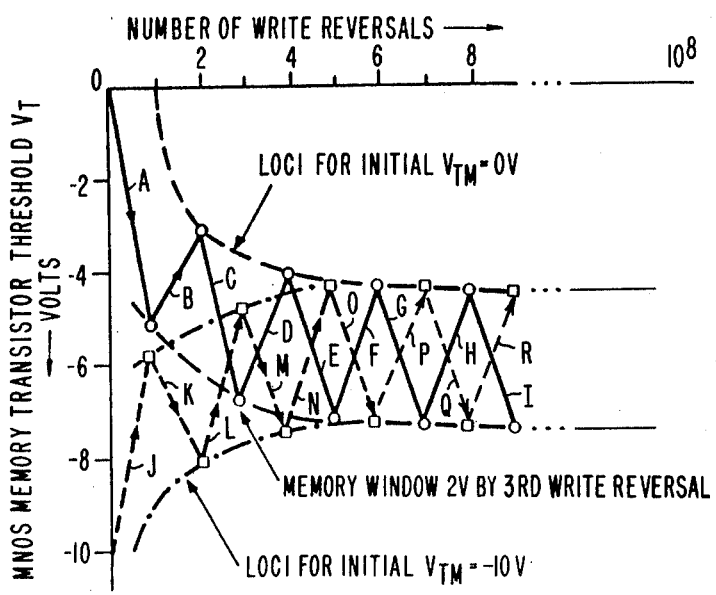
FIG. 1 is a graph showing the effect of the number of write reversals on the threshold voltage of an MNOS memory transistor.

Referring now to the drawings, a graph is shown in FIG. 1 which shows the effect of a number of write reversals on the threshold voltage of a metal nitride oxide (MNOS) memory transistor. The ordinate represents the MNOS memory transistor threshold, $V_T$, in volts. The abscissa represents the number of write reversals. Data corresponding to measurements made for a transistor having an initial threshold voltage equal to zero volts is shown by the circles. Initially the memory transistor having a threshold voltage of zero volts was written towards the high threshold voltage state or logic zero which is shown by curve A. The threshold voltage of the memory transistor shifted from zero volts to approximately −5 volts. The memory transistor was then written towards a low threshold voltage or logic one wherein the threshold voltage was shifted from −5 volts to −3 volts as shown by curve B. The memory transistor was subsequently written towards the high threshold voltage or logic zero wherein the threshold voltage of the memory transistor shifted from −3 volts to −7 volt as shown by curve C. The memory transistor was subsequently written towards the low threshold voltage state or logic one wherein the threshold voltage of the memory transistor is shifted from −7 volts to −4 volts as shown by curve D. The memory transistor was subsequently written towards the high threshold voltage state or logic zero wherein the threshold voltage of the memory transistor is shifted −4 volts to −7.3 volts as shown by curve B. Subsequent write reversals of the memory transistor result in the threshold voltage being shifted as shown by curves F, G, H, and I wherein the threshold voltage shifts from about −4.5 volts for the low threshold voltage state or logic one to −7.5 volts for the high threshold voltage state or logic zero.

If the threshold voltage of the memory transistor is initially −10 volts, then upon writing the memory transistor towards a low threshold voltage or logic one, the threshold voltage of the memory transistor will shift from −10 volts to −6 volts as shown by curve J. Data corresponding to consecutive write reversals where the memory transistor has an initial threshold voltage of −10 volts is shown in FIG. 1 by squares. If the memory device is subsequently written towards the high threshold state or logic zero, the threshold voltage of the memory transistor will shift from −6 volts to −8 volts as shown by curve K. If the memory is subsequently written towards the low threshold voltage state or a logic one, the memory transistor threshold voltage will shift from −8 volts to −5 volts as shown by curve L. If the memory transistor is subsequently written towards the high threshold voltage state, the threshold voltage of the memory transistor will shift from −5 volts to −7.5 volts as shown by curve M. Additional subsequent write reversals will result in the threshold voltage of the memory transistor shifting from −7.5 volts to 4.5 volts as shown by curves N, O, P, Q, and R. If the threshold voltage of the memory transistor is betwen zero volts and −2.5 volts or between −10 volts and −8.5 volts, the memory transistor threshold voltage is considered to be saturated. In the region between −2.5 volts and −8.5 volts the transistor is considered to be non-saturated. That is to say, a write cycle will result in a shift in the memory voltage which will result in the threshold voltage shifting either to the low threshold state or to the high threshold voltage state. The memory transistors may have their threshold voltages shifted back and forth by successive write reversals numerous times such as $10^8$ with a predictable and controllable threshold voltage shift. Furthermore by viewing FIG. 1 it might be seen that regardless of the initial threshold voltage of the memory transistor, if subsequent write reversals are performed, the memory transistor threshold voltage will shift from a low threshold voltage such as −4.5 volts to a high threshold voltage such as −7.5 volts. The data in FIG. 1 was obtained with a write pulse width of 0.7 microseconds and the threshold voltage was measured one second after the write pulse. The memory transistors were MNOS/SOS drain source protected field effect transistors.

Referring now to FIG. 2, a block diagram of one embodiment of the invention is shown which is useful, for example, as a random access memory having a fast write time. The block diagram as shown in FIG. 2 is suitable for implementation on an integrate circuit or silicon chip. The memory is organized 256 words by two bits wherein one bit is fed from I/O buffer 10 and the other from I/O buffer 12, on lines 154 and 154' respectively. Memory array 17 holds 256 words by one bit and memory array 18 holds 256 words by one bit. Memory arrays 17 and 18 are organized internally as 32 word by 8 bit memories wherein column decoders 20 and 21 select one of the 8 bits to organize the data in memory arrays 17 and 18 to appear as 256 words by one bit. Address signals A0' through A4' are distributed over bus 22 to row decoders 25, 26, 23 and 28. Decoder 25, for example, functions to decode the 5-bit address, A0' through A4' and in response thereto selects one of 32 rows leading into memort array 17. Each decoder likewise selects one row of 32 rows leading into the respective memory array in response to the decoded address. Each memory cell in memory arrays 17 and 18 comprise two variable threshold transistors wherein decoder 25 selects one transistor of the memory cell and decoder 26 selects the other transistor in the memory cell. Likewise decoders 23 and 28 each select one of the memory transistors in the memory cell in memory array 18. Further description is provided of the memory array and related circuitry in FIG. 3A. Address signals A5 through A7 are coupled over lines 24, 45 and 46 respectively to Y decoder 27. Y decoder 27 functions to decode the address signals A5 through A7 and to select one of eight lines of Y1 through Y8 and $\overline{Y1}$ through $\overline{Y8}$ coupled to column decoder 20 and 21. Address enable bar, $\overline{AE}$, is coupled over line 29 to address enable buffer 30. Address enable buffer 30 function to level shift the control signal and to provide the true and complement. The output data DI' and $\overline{DIR}$ its complement from memory array 17 is coupled out of column detector 32 to an input of write comparator 35 over lines 172 and 173 and to an input of I/O buffers 10 over lines 131 and 123. Likewise the output of column detector 32 representative of the data from memory array 18 is coupled to an input of write comparator 37 over lines 172' and 173' and to an input of I/O buffer 12 over lines 131 and 123. The input write data, DIW, passes over line 167 to an input of write comparator 35. The input write data DIW' passes over line 167' to an input of write comparator 37. An output DI' of write comparator 35 representative of the data to be written into memory array 17 during the write cycle is coupled out on line 40 to an input of row decoder 25 and 26 and to an input of column decoder 20. An output $\overline{DI'}$ of write comparator 35 representative of the complement of the data to be written is coupled over line 43 to an input of row decoder 25 and 26 and to an input of column decoder 20. An output of write comparator 37 representative of the data to be written in memory array 18 is coupled over line 42 to an input of row decoder 23 and 28 and an input of column decoder 21. An output $\overline{DI''}$ of write comparator 37 representative of the complement of the data to be written is coupled over line 44 to an input of row decoder 23 and 28 and an input of column decode 21. Timing control signals which are connected internal to various parts of the block diagram in FIG. 2 are as follows: $\overline{AES}$, $\overline{MW}$, W', $\overline{CS}$, AEP and $\overline{AE'}$. These timing control signals are generated by timing and control circuit 6 as shown in FIG. 2 and may be common to many similarly connected chips in the operation of a larger memory. Typical voltages for the circuitry of FIGS. 3A through 3F which utilizes P channel transistors and N channel depletion mode transistors in the logic and MNOS memory transistors are as follows: $V_{DD}$ + 12 volts, $V_{SS}$ zero volts, $V_{NN}$ −8 volts, and $V_{PP}$ −18 volts.

In operation to read data out of the memory shown in FIG. 2 address lines A0 through A4 will be decoded by row decoders 25, 26, 23 and 28 which will select one of 32 lines from each decoder going to either memory array 17 or memory array 18. Prior to the decoder selection, address enable AE' from buffer 30 provides a signal to decoders 25, 26, 23 and 28 to precharge all of the 32 lines from each decoder going into memory arrays 17 and 18. In addition, column decoder 20 and column decoder 21 precharged the column lines Y1 through Y8 going into memory arrays 17 and 18. When the row line is selected from row decoder 25 and 26 a memory cell in memory array 17 for example will provide an output signal to column detector 32 which will determine whether the output signal of a particular memory cell is a logic one or a logic zero. Column detector 33 responds in a similar fashion to signals from memory array 18 in response to a selected row from row decoder 23 and 28. An alternate embodiment of the invention would for example provide a column detector 32 for each column. One of eight outputs of column detector 32 would be selected by column decoder 20. In the embodiment in FIG. 2 column detector 32 provides an output signal indicative of the data stored in a particular memory cell in memory array 17 over lines 131 and 123 to I/O buffer 10 and out over line 154. Column detector 33 and column decoder 21 function similarly to provide an output signal over lines 131' and 123' to I/O buffer 12 and out on line 154'.

The operation of the embodiment in FIG. 2 during write mode is as follows: Input write data DIW and DIW' is provided to write comparators 35 and 37 respectively. Timing and control circuit 6 initiates a read sequence to read the contents of the memory cell which is to be written into by the write data. The particular memory cell is identified by the signals on the address lines. When the contents of the particular memory locations have been read and presented to write comparator 35 by signals DIR and $\overline{DIR}$, write comparator 35 compares the read data to the desired write data and if they are the same, inhibits further write operation in memory array 17. If however the data is different, then write comparator 35 allows a write sequence, cycle or operation in memory array 17. During write operation the voltage on the selected rows from row decoder 25 carry a voltage +12 or −18 volts to one side or to the gate of one transistor of the memory cell while the other transistor is written according to voltage +12 or −18 volts on the selected row from decoder 26. Column decoder 20 also provides certain voltages in conjunction with column detector 32 on the lines extending in the column direction to memory array 17. The voltages are arranged to simultaneously write a logic one or low threshold voltage in one memory transistor of a memory cell while writing a high threshold voltage or a logic zero in the other memory transistor of the memory cell. The operation for writing into memory array 18 is identical to that previously described for writing into memory array 17. The presence of correct polarizing voltages on the variable threshold transistors for a short amount of time such as 0.7 microseconds is sufficient to shift the threshold voltage of the memory transistor to the desired level indicative of the input write data DIW. Since two memory transistors are written in opposite directions, the difference in signal output of the two transistors is maximized. Detection circuitry such as shown by column detector 32 in FIG. 3A has enabled detection of the memory cell state where the differences in the threshold voltages of the two memory transistors in the memory cell were as close as ½ volt.

With the write pulse width and amplitude selected to provide memory transistor threshold voltage shifts of about 3 volts, it is important to prevent shifting of the memory transistor threshold voltages into opposite saturation states which would occur if the memory element was rewritten with the same data several times in a row. The operation of the write comparator 35 prevents rewriting of the same data into the same memory location by providing a read before write cycle and an inhibit means during write. If the new data to be written is the same as the data read out of the memory, the write polarization voltages for the memory element are inhibited which is permissible since the memory element is already in the correct state. Thus, all writes to the memory system will not necessarily result in a write into a memory element or cell, which increases the memory endurance. Memory endurance is limited by the number of write cycles the memory transistors experience while read cycles have no effect on memory endurance. In addition each memory transistor in the memory cell experiences the same number of write cycles and write reversals from one state to the other.

Figure 3A:
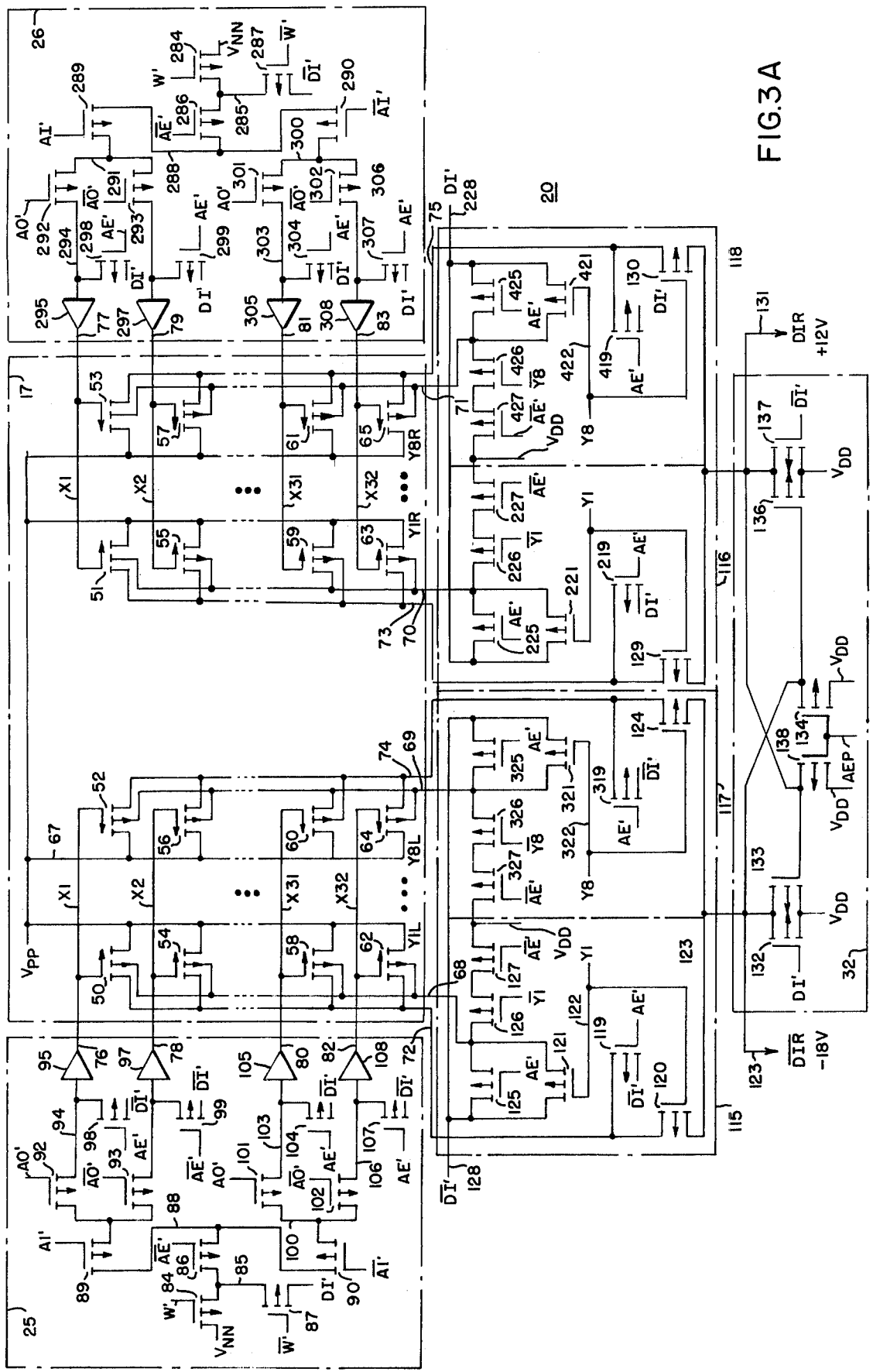
FIG. 3A is a circuit schematic of portions of the embodiment of FIG. 2.

A detailed circuit schematic of memory array 17 is shown in FIG. 3A. Memory array 17 consists of thirty-two rows designated X1 through X32 and eight columns designated Y1 through Y8. Each memory cell is comprised of two variable threshold transistors wherein during write operation each transistor threshold voltage is written in the opposite direction to one another. Memory cell 1/1 or row 1, column 1 consists of memory transistor 50 and memory transistor 51. Memory cell ⅛ or row 1, column 8 consists of memory transistors 52 and 53. Memory cell 2/1 or row 2, column 1 consists of memory transistors 54 and 55. Memory cell 2/8 or row 2, column 8 consists of memory transistors 56 and 57. Memory cell 31/1 or row 31, column 1 consists of memory transistors 58 and 59. Memory cell 31/8 or row 31, column 8 consists of memory transistors 60 and 61. Memory cell 32/1 or row 32, column 1 consists of memory transistors 62 and 63. Memory cell 32/8 or row 32, column 8 consists of memory transistors 64 and 65. The memory transistors in memory array 17, such as transistors 50 through 65, are p-channel enhancement mode transistors, each having a gate, drain, source and substrate body. The gate dielectric to provide a variable threshold characteristic may be for example a layer of silicon nitride over a layer of silicon dioxide. Memory cell 1/1 may be considered to have a left side consisting of transistor 50 and a right side consisting of transistor 51. Likewise, the other memory cells may be considered to have a left side and right side wherein the left side comprises transistors 52, 54, 56, 58, 60, 62 and 64 wherein the right side comprises transistors 53, 55, 57, 59, 61, 63 and 65. The left side of the memory cells are decoded by row decoder 25 which selects the addressed row and column decoder 20 which selects the addressed column. The right side of the memory cells are decoded by decoder 26 which selects the row address and column decoder 20 which selects the column address. All of the drains of all of the memory transistors in memory array 17 are coupled over line 67 to voltage supply $V_{pp}$. The substrate body of the memory transistors on the left side of the memory cells in column 1, such as transistors 50, 54, 58 and 62, are coupled over the 68 to column decoder 20. The substrate body of the memory transistors on the left side of all of the memory cells in column 8, such as transistors 52, 56, 60 and 64 are coupled over line 69 to column decoder 20. The substrate body of the memory transistors of the right side of all of the memory cells in column 1, such as transistors 51, 55, 59 and 63 are coupled over line 70 to column decoder 20. The substrate body of the memory transistors of the right side of all of the memory cells in column 8, such as transistors 53, 57, 61 and 65, are coupled over line 71 to column decoder 20. The substrate body of the memory transistors in a column of commonly connected substrate bodies of left side transistors or of right side transistors of a memory cell are isolated electrically from one another to enable opposite polarity voltages to be placed on selected columns — that is to say, may be charged to +12 volts, or pulled to −18 volts. One example of a means to isolate the substrate bodies of the transistors in a column is by placing the silicon for the transistors on sapphire, leaving gaps in the silicon, such as by etching, to provide isolation. The sources of the memory transistors on the left side of the memory cells in column 1 are coupled over line 76 to column decoder 20. The sources of the memory transistors on the right side of the memory cells in column 1 are coupled over line 73 to column decoder 20. The sources of the memory transistors on the left side of the memory cells in column 8, such as transistors, 52, 56, 60 and 64, are coupled over line 74 to column decoder 20. The sources of the memory transistors of the right side of the memory cells in column 8, such as transistors 53, 57, 61 and 65 are coupled over line 75 to column decoder 20.

In memory array 17, the gates of the memory transistors on the left side of the memory cells in row 1 are coupled over line 76 to decoder 25. The gates of the memory transistors of the right side of the memory cells in row 1 are coupled over line 77 to decoder 26. The gates of the memory transistors of the left side of the memory cells in row 2 are coupled over line 78 to decoder 25. The gates of the memory transistors of the right side of the memory cells in row 2, such as transistors 55 and 57, are coupled over line 79 to decoder 26. The gates of the memory transistors of the left side of the memory cells in row 31, such as transistors 58 and 60, are coupled over line 80 to decoder 25. The gates of the memory transistors of the right side of the memory cells in row 31, such as transistors 59 and 61, are coupled over line 81 to decoder 26. The gates of the memory transistors of the left side of the memory cells in row 32, such as transistors 62 and 64, are coupled over line 82 to decoder 25. The gates of the memory transistors of the right side of the memory cells in row 32, such as transistors 63 and 65, are coupled over line 83 to decoder 26.

Figure 5B:
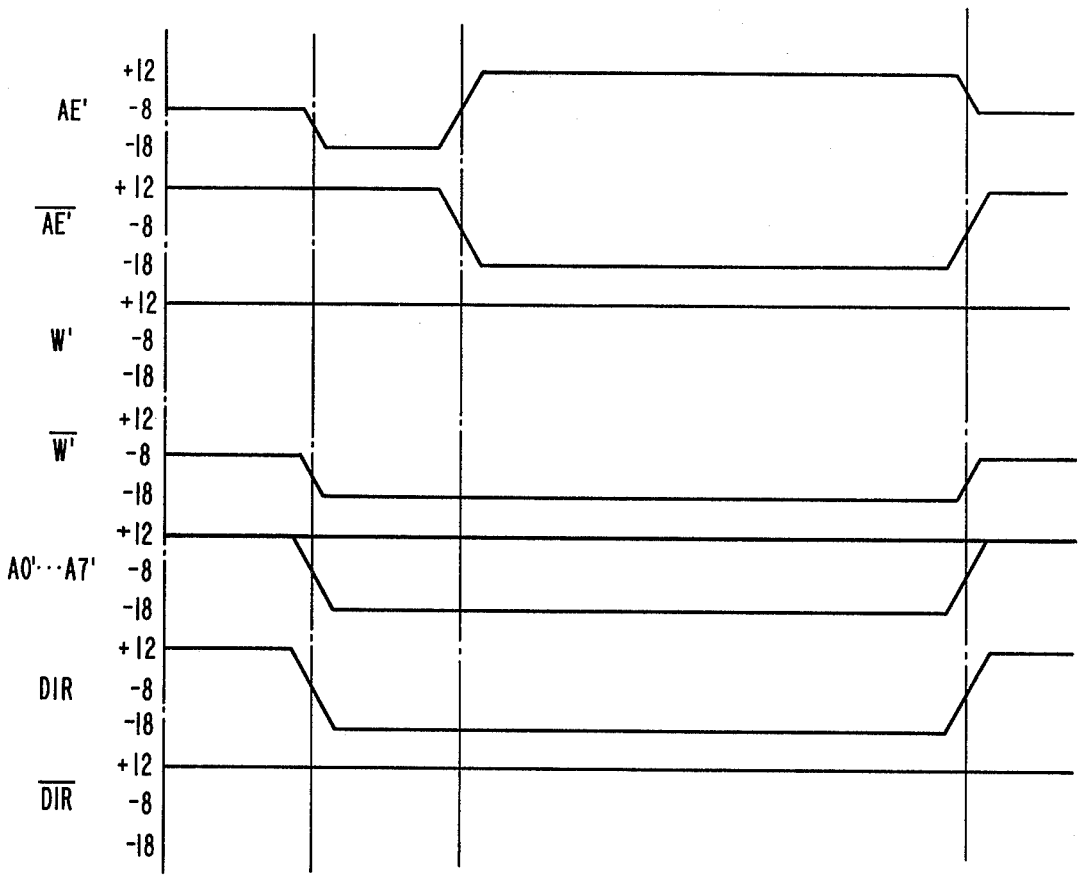
FIGS. 5A and 5B show typical signal waveforms for the circuits of FIG. 3 during a write cycle.
Figure 3B:
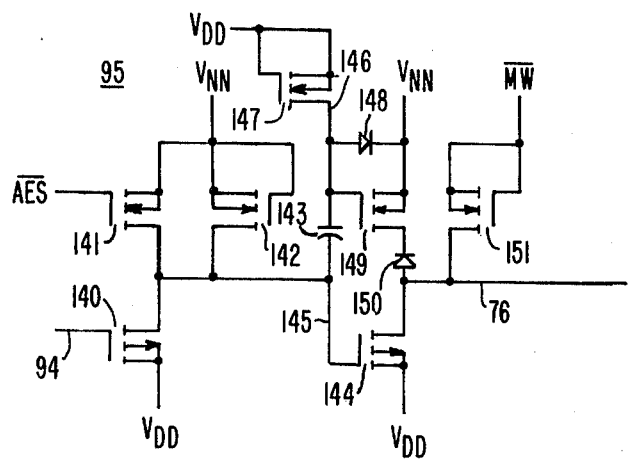
FIG. 3B is a circuit schematic of a buffer circuit for the row decoder.
Figure 5A:
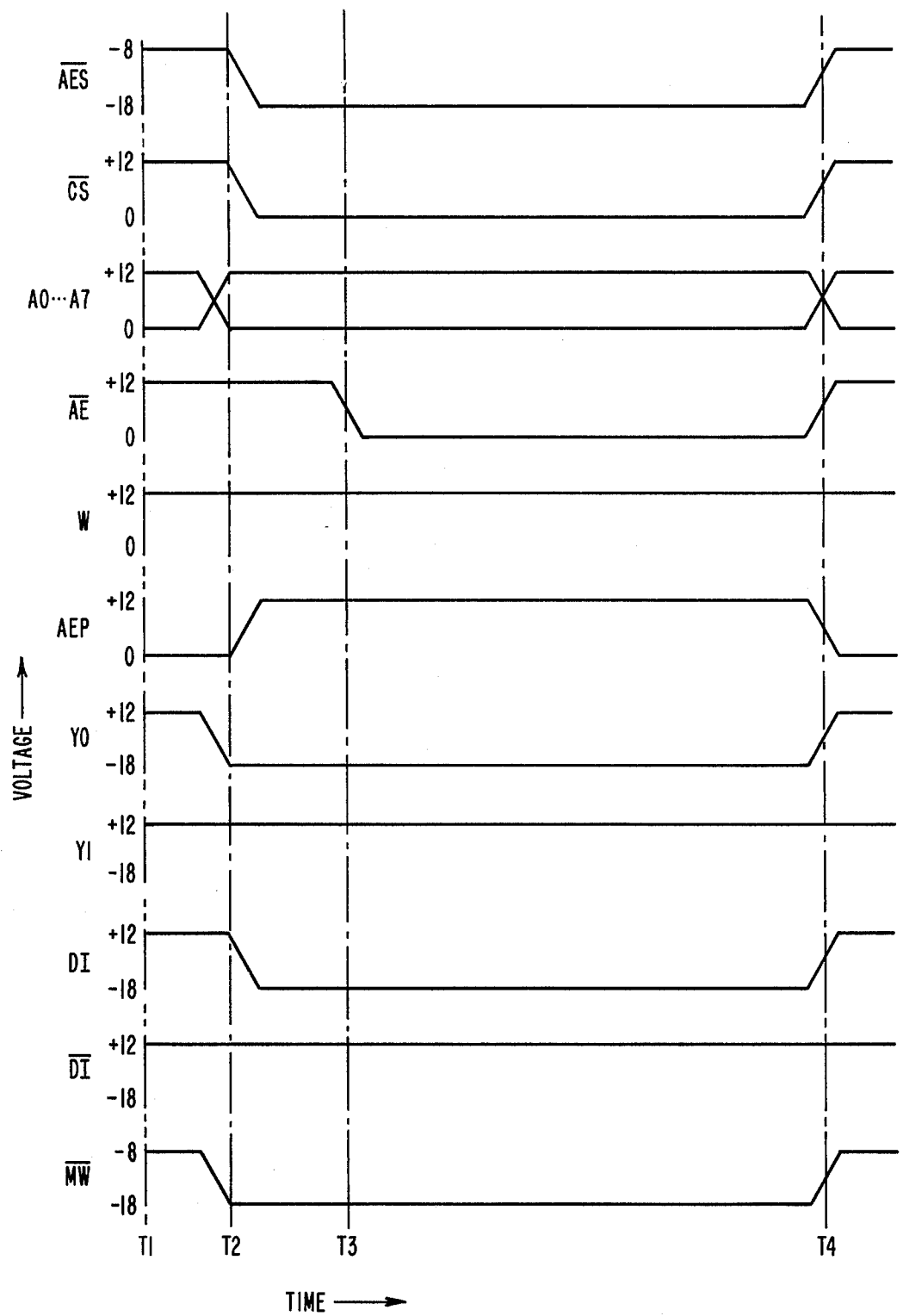

Row decoder 25 controls the voltages of the gates of the memory transistors of the left side of all of the memory cells of memory array 17. Voltage supply $V_{NN}$ is coupled to the drain of transistor 84, having the gate coupled to signal W'. The source of transistor 84 is coupled over line 85 to drain of transistor 86 and the drain of transistor 87. The gate of transistor 87 is coupled to signal $\overline{W}'$ and the gate of transistor 86 is coupled to signal $\overline{AE}'$. The source of transistor 87 is coupled to signal DI'. The source of transistor 86 is coupled over line 88 to the drain of transistor 89 and the drain of transistor 90. Transistors 84, 86 and 87 function to switch either voltage $V_{NN}$ to line 88 or the voltage of signal DI'. The source of transistor 89 is coupled over line 91 to the drains of transistors 92 and 93. The gate of transistor 89 is coupled to A1' and the gate of transistor 92 is coupled to A0'. The gate of transistor 93 is coupled to $\overline{A0}'$. The source of transistor 92 is coupled over line 94 to an input of buffer 95. The output of buffer 95 is coupled to line 76. The source of transistor 93 is coupled over line 96 to an input of buffer 97, having an output coupled to line 78. Line 94 is coupled to the drain of transistor 98 having its source coupled to signal $\overline{DI}'$. The gate of transistor 98 is coupled to signal AE'. Line 96 is coupled to the drain of transistor 99, having its source coupled to data signal $\overline{DI}'$. The gate of transistor 99 is coupled to AE'. The source of transistor 90 is coupled over line 100 to the drain of transistors 101 and 102. The source of transistor 101 is coupled over line 103 to the drain of transistor 104 and to an input of buffer 105, having an output coupled to line 80. The gate of transistor 104 is coupled to signal AE' and the source is coupled to signal $\overline{DI}'$. The source of transistor 102 is coupled over line 106 to the drain of transistor 107 and an input of buffer 108, having an output coupled to line 82. The gate of transistor 107 is coupled to signal AE' and the source is coupled to data signal $\overline{DI}'$. Transistors 89 and 92 function as a decode tree for passing the voltage on line 88 through the decode tree to line 94. Line 94 is precharged to the voltage of signal $\overline{DI}'$ when transistor 98 is turned on by signal AE'. For simplicity, only two address bits are shown in the decode tree, A0' and A1', but it is understood to one skilled in the art that the decode tree would consist of five transistors in series with the additional address signals of A2', A3' and A4' to provide a decode tree to select one of 32 rows in memory array 17. Row decoder 25 is unique in that the voltage of the data DI' is routed during write operation through the decode tree of a selected row while the rest of the rows are charged to the voltage level of data signal $\overline{DI}'$. The buffers, such as buffer 95, function during read operation to accept binary signals +12 volts and −8 volts and to present at its output noninverted voltage levels +12 volts and −8 volts. During write operation, the buffers in decoder 25, such as buffer 95, function to accept +12 volts and −8 volts and to provide a noninverting output of +12 volts and −18 volts. The −18 volts voltage supply to buffer 95 is supplied by signal $\overline{MW}$ which is shown in FIG. 5A. A detailed circuit schematic of a buffer suitable for buffer 95 is shown in FIG. 3B.

Row decoder 26 is identical in hardware to row decoder 25. The buffers of row decoder 26 are coupled to lines 77, 79, 81 and 83 which represent the various row of the memory array 17 which ar coupled to the right side of the memory cells. In place of data signal DI' shown in decoder 25, the signal $\overline{DI}'$ is used, such as at the source of transistor 109. In place of the data signal $\overline{DI}'$ in decoder 25, the signal DI' is used, such as at the source of transistors 110, 111, 112 and 113.

Therefore, it may be seen that when all of the inputs to the buffers in row decoder 25 are precharged to the data signal $\overline{DI}'$ the same voltage nodes in row decoder 26 are being charged to DI', as shown in FIG. 5A. During the read mode, the input to the buffers in row decoder 25 and in row decoder 26 are +12 volts. During read mode, the voltage $V_{NN}$ or −8 volts passes through the decode trees of row decoders 25 and 26 to charge the input line to the buffer of the selected row to −8 volts. During write, however, the voltage of data signal DI', which may, for example, be −18 volts as shown in FIG. 5A, would pass through the decode tree of row decoder 25 to the input of a buffer of a selected row. In contrast, concomitantly the voltage of signal $\overline{DI}'$ or +12 volts would be passed through the decode tree of row decoder 26 to the input of the buffer of the selected row while all the other non-selected rows had been precharged to the voltage of signal DI', or −18 volts.

Column decoder 20 functions to precharge the source and substrate body of all of the memory transistors in memory array 17. In addition, Column decoder selects a particular memory cell column during READ or WRITE operation. The column decoder circuitry associated with the left side of a memory cell in column 1 is shown as column circuitry 115. The portion of the column decoder associated with the right side of a memory cell in column 1 is designated in FIG. 3 by column circuitry 116. The column decode circuitry associated with the left side of a memory cell in column 8 is designated as column circuitry 117. The column decoder circuitry associated with the right side of a memory cell in column 8 is designated as column circuitry 118.

Line 72 from memory array 17 is coupled to the drain of transistor 119 and the drain of transistor 120. The source of transistor 119 is coupled to data signal $\overline{DI}'$ and the gate is coupled to control signal $\overline{AE}'$. The gate of transistor 120 is coupled to the gate of transistor 121 over line 122 and to signal Y1. The source of transistor 120 is coupled over line 123 to the source of transistor 124 and to an input of column detector 32.

Line 68 from memory array 17 is coupled to the drains of transistors 125, 126 and 121. The gate of transistor 125 is coupled to control signal $\overline{AE}'$. The gate of transistor 126 is coupled to $\overline{Y1}$ and the source is coupled to the drain of transistor 127. The gate of transistor 127 is coupled to control signal $\overline{AE}'$ and the source is coupled to voltage source, $V_{DD}$. The transistors in column circuitry 115 may be, for example, P channel enhancement mode having a threshold voltage of −2 volts.

Data signal $\overline{DI}'$ is coupled over line 128 to the source of transistor 125 and the source of transistor 121 of column circuitry 115.

Column circuitry 116 may, for example, be the same circuitry as column circuitry 115 except coupled to lines 73 and 70 instead of 72 and 68 and data signal $\overline{DI}'$ on the source of transistor 119 would be replaced by data signal $\overline{DI}'$. Column circuitry 117 may, for example, be the same as column circuitry 115 except it is coupled to lines 74 and 69 in place of lines 72 and 68 and signal Y1 is replaced with signal Y8 as shown in FIG. 3A. Column circuitry 118 is the same as column circuitry 115 except it is coupled to lines 75 and 71 instead of lines 72 and 68 and signals Y8 and D1' are used instead of Y1 and $\overline{D1}$, respectively. The output of column circuitry 116 and 118 is the source of transistor 129 and the source of transistor 130 respectively, which is coupled over line 131 to column decoder 32. It is understood that the column circuitry for columns Y2–Y7 are not shown but that each column would require the column circuitry and arranged in the same manner as column circuitry 115 and column circuitry 116 which provides the column circuitry for column Y1 of memory array 17. The outputs of the column circuitry coupled to the left side of the memory cells is coupled to line 123 and the output of the column circuitry associated with the right side of the memory cells is coupled to line 131. Therefore, line 123 during the READ operation has a data signal from the left side of the selected memory cell and line 131 has the data signal from the right side of the selected memory cell.

Column detector 32 functions to detect which of the input lines, 123 or 131 has the highest conductance or will discharge the line the fastest. Line 123 is coupled to the drain of transistors 132 and 133, the drain of transistor 134 and to one input of buffer circuit 135. Line 131 is coupled to the drains of transistors 136 and 137, the drain of transistor 138 and to a second input of buffer circuit 135. The gate of transistor 132 is coupled to data signal DI' and the gate of transistor 137 is coupled to data signal $\overline{DI}'$. The sources of transistors 132, 133, 138, 134, 136, and 137 is coupled to voltage source $V_{DD}$. The gate of transistor 133 is coupled to the drain of transistor 138 over line 131. The gate of transistor 136 is coupled to the drain of transistor 134 over line 123. The gates of transistors 138 and 134 are coupled to control signal AEP which functions to precharge lines 131 and 123 to the voltage level of $V_{DD}$ or +12 volts during the read cycle before the binary state of the memory cell is sensed. During READ operation DI' and $\overline{DI}'$ are held to +12 volts. During WRITE operation either DI' or $\overline{DI}'$ goes to −18 volts which couples voltage source $V_{DD}$ through the transistor to either line 123 or line 131. During READ operation the sensed memory cell is detected by column detector 132 after which the binary states of the sensed memory cell appear on lines 123 and 131.

Referring now to FIG. 3B a circuit schematic is shown as one example of a circuit that would be suitable for buffers 95, 97, 105, and 108. Data input line 94 is coupled to the gate of transistor 140 having a source coupled to voltage supply $V_{DD}$. The drain of transistor 140 is coupled to the drain of transistors 141 and 142, capacitor 143 and the gate of transistor 144 by means of line 145. The gate of transistor 141 is coupled to control signal $\overline{AES}$ and the source is coupled to voltage supply $V_{NN}$. The source and gate of transistor 142 is coupled to voltage supply $V_{NN}$. The other side of capacitor 143 is coupled over line 146 to the drain of transistor 147, the anode of diode 148 and the gate of transistor 149. The cathode of diode 148 is coupled to voltage supply $V_{NN}$ along with the source of transistor 149. The drain of transistor 149 is coupled to the cathode of diode 150 having the anode connected to the drain of transistor 144. The source of transistor 144 is coupled to voltage supply $V_{DD}$. The drain of transistor 144 is also coupled over line 76 to the drain of transistor 151 and acts as the data output line. The source and gate of transistor 151 is coupled to control signal $\overline{MW}$. The gate and source of transistor 147 is coupled to voltage supply $V_{pp}$. Transistors 140 and 144 are P channel enhancement mode devices and transistors 141, 142, 147, 149 and 151 are N channel depletion mode devices. When control signal $\overline{AES}$ is −8 volts transistor 141 is conducting and tends to hold line 148 to −8 volts. Transistor 142 acts as a load resistor or current source to −8 volts. When control signal $\overline{AES}$ is −18 volts, transistor 141 is non-conducting and no longer holds line 145 to −8 volts. If the input signal on line 94 is +12 volts, transistor 140 will be non-conducting and line 145 will be held at −8 volts by transistor 142. Transistor 144 will be in the conducting state since its gate voltage is at −8 volts and the output line 76 will be pulled to +12 volts due to the connecting state of transistor 144 which is coupled to power supply $V_{DD}$. Transistor 147 acts as a load resistor or current source which pulls the voltage on line 146 to −18 volts which puts transistor 149 in a non-conducting state. Transistor 151 acts as a load resistor or current source to the voltage of control signal $\overline{MW}$ but is unable to conduct sufficient current to pull line 76 towards −8 volts. The output, therefore, remains at +12 volts on line 76. If $\overline{AES}$ is −18 volts and the input on line 94 is −8 volts then transistor 141 will be non-conducting and transistor 140 will be conducting pulling line 145 to +12 volts which will place transistor 144 in the non-conducting state. When line 145 is pulled to +12 volts current will pass through capacitor 143 pulling line 146 to −7.3 volts due to current flowing through diode 148 to voltage supply $V_{NN}$. Transistor 149 will be placed in the conducting state pulling line 76 to −8 volts. If control signal $\overline{MW}$ is −8 volts, then transistor 151 will act as a load current source to hold line 76 at −8 volts. If, however, control signal $\overline{MW}$ is −18 volts, such as during a WRITE cycle at time T2 to T4 as shown in FIG. 5A, line 76 will then be pulled to −18 volts due to transistor 151 and diode 150 will be back biased and prevent any current from being pulled through transistor 149. The low voltage output of the buffer circuit can therefore be pulled from −8 volts to −18 volts by control signal $\overline{MW}$ at predetermined times, while the positive voltage output is always +12 volts. For a motor detailed description of one example of a buffer circuit, reference is made to copending Application Ser. No. 740,267, filed Nov. 9, 1976 (W. E. Case 46,161), entitled "Complementary MNOS Logic Circuit" and assigned to the assignee herein, which is incorporated herein by reference.

Figure 3C:
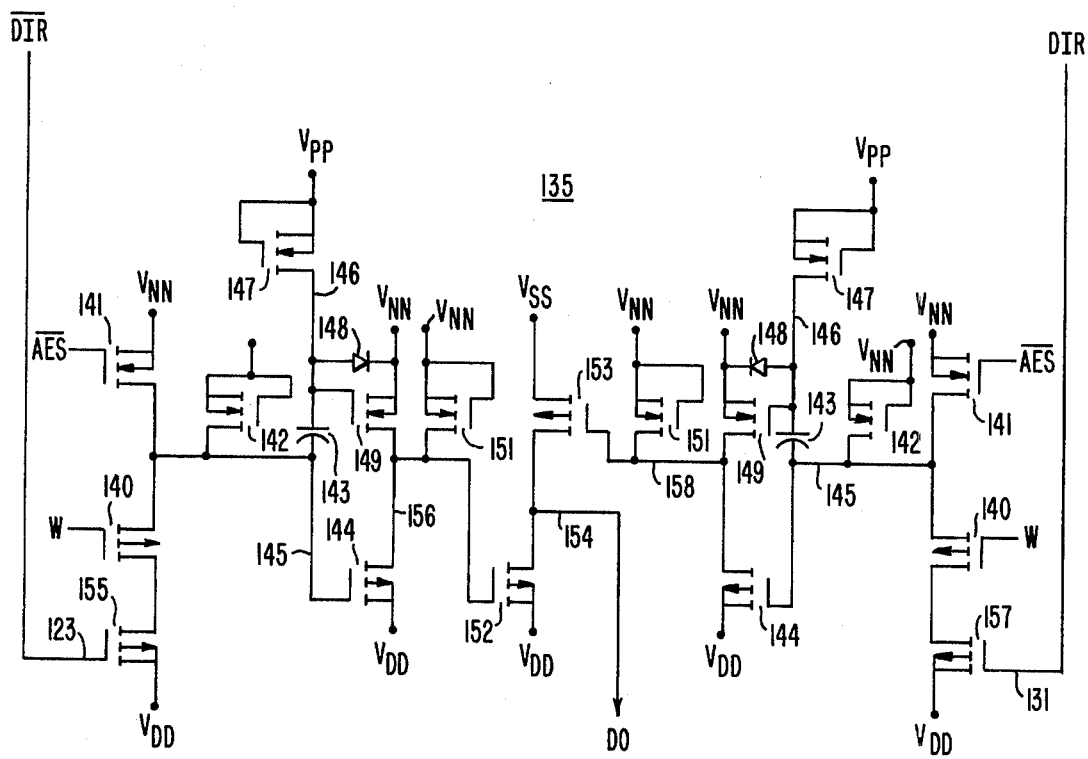
FIG. 3C is a circuit schematic of a buffer circuit for the output signal.
Figure 4A:
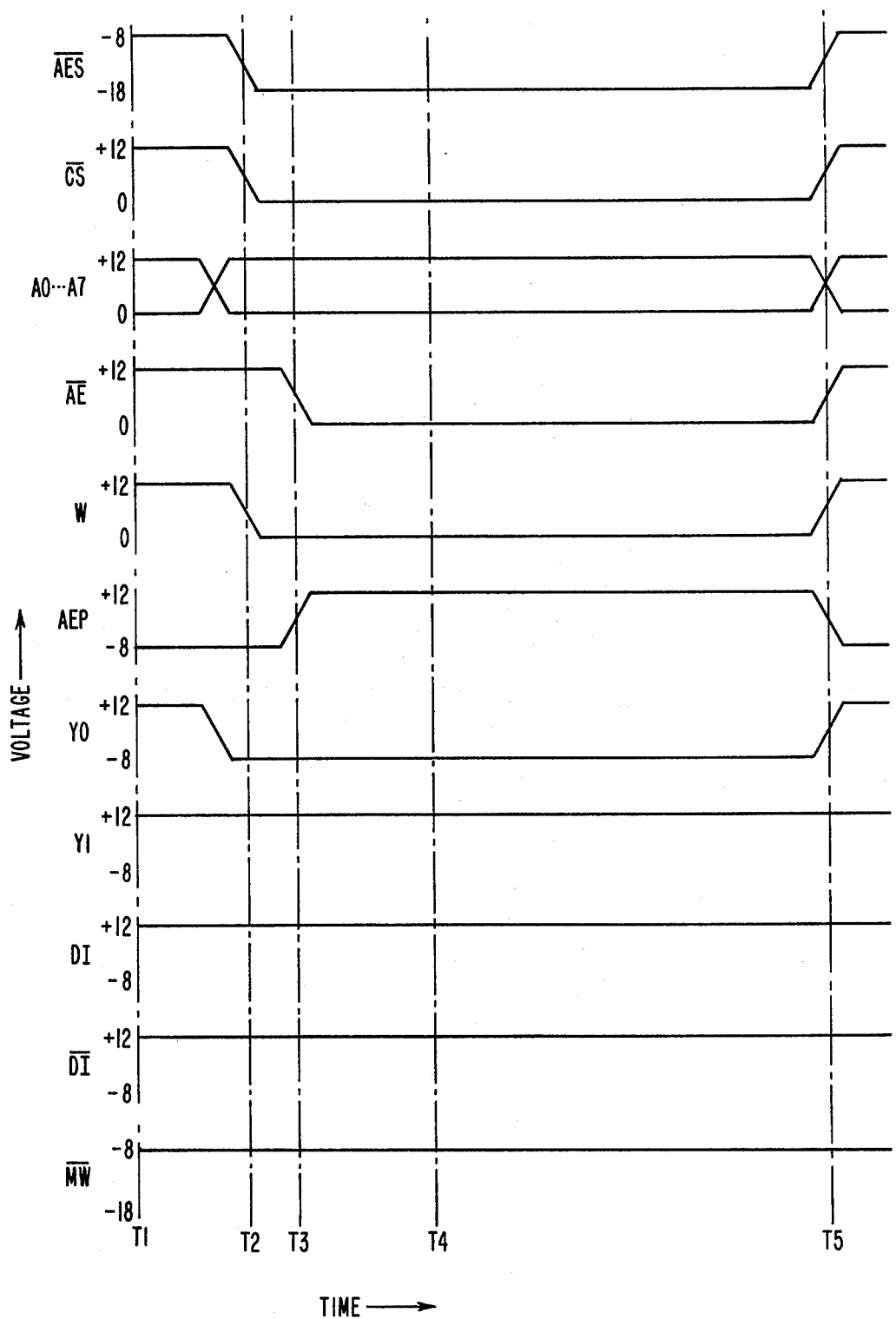
FIGS. 4A and 4B show typical signal waveforms for the circuits of FIG. 3 during a read cycle.

Referring now to FIG. 3C, like references are used for functions corresponding to the apparatus of FIG. 3B. Buffer circuit 135 functions to provide a low impedance output during READ operation from T2-T5 as shown in FIG. 4A due to control signal W. During the WRITE cycle as shown in FIG. 5A, W remains at +12 volts which will force transistors 152 and 153 into the non-conducting state leaving output line 154 floating. Input line 123 is coupled to the gate of transistor 155 having its source coupled to voltage supply $V_{DD}$. The drain of transistor 155 is coupled to the source of transistor 140. The gate of transistor 140 is coupled to control signal W. The drain of transistor 144 is coupled over line 156 to the drain of transistors 149 and 151 and to the gate of transistor 152. The source of transistor 152 is coupled to voltage supply $V_{DD}$. The drain of transistor 152 is coupled over line 154 to the source of transistor 153 and functions as an output data line. The drain of transistor 153 is coupled to voltage supply $V_{SS}$ which is normally at 0 volts.

Input line 131 is coupled to the gate of transistor 157 having its source coupled to voltage supply $V_{DD}$. The drain of transistor 157 is coupled to the source of transistor 140 and its gate is coupled to control signal W. The gate of transistor 153 is coupled over line 158 to the drain of transistors 151, 149 and 144.

If control signal $\overline{AES}$ to buffer circuit 135 is at −8 volts, transistors 141 will be conducting which will pull line 145 to −8 volts which will cause transistor 144 into the conducting state. With transistor 144 in the conducting state, line 156 will be pulled to +12 volts which will cause transistor 152 to be non-conducting. Line 158 will be pulled to +12 volts causing transistor 153 to be non-conducting, resulting in line 154 being isolated or floating by two non-conducting transistors, namely transistors 152 and 153. If control signal $\overline{AES}$ is −18 volts, then transistor 141 will be non-conducting, but line 145 will be pulled down to −8 volts by load transistor 142 which acts as a current source. Then if control signal W as shown in FIG. 4 at time T2 goes to 0 volts, transistor 140 will be in the conducting state, and if the voltage on line 123 is −18 volts, then transistor 155 will be in the conducting state. If the voltage on line 131 is +12 volts, transistor 157 will be in the non-conducting state. With transistor 157 in the non-conducting state, line 145 will remain at −8 volts and line 158 will be pulled to +12 volts forcing transistor 153 into the non-conducting state. With transistors 155 and 140 in the conducting state, line 145 will be pulled to +12 volts which will turn transistor 144 to the non-conducting state and transistor 149 to the conducting state, causing line 156 to be pulled to −8 volts which in turn will turn transistor 152 to the conducting state. With transistor 152 turned on, line 154 will be pulled to +12 volts. If, however, the voltage on line 123 is +12 volts and the voltage on line 131 is −18 volts, then transistor 155 will be non-conducting and transistor 144 will be conducting, causing line 156 to be charged to +12 volts which in turn will turn off transistor 152 to the non-conducting state. With the voltage on line 131 at −18 volts, transistors 157 and 140 will be in the conducting state, causing line 145 to be pulled to +12 volts which in turn will cause transistor 144 to go in the non-conducting state and transistor 149 to be in the conducting state. Line 158 will be pulled to −8 volts which will turn transistor 153 on or into the conducting state which will pull line 154 to the voltage supply $V_{SS}$ or 0 volts. It shall be noted that the source and gate of transistor 151 is coupled to voltage supply $V_{NN}$ which is, for example, −8 volts. Buffer circuit 135 therefore during READ operation will respond to the input lead having the most negative voltage and will turn either transistor 152 or 153 into the conducting state, causing line 154 to be coupled to $V_{DD}$ +12 volts, or $V_{SS}$, 0 volts. If control signal W is +12 volts, then regardless of the voltages on lines 123 transistors 152 and 153 will be non-conducting and line 154 will be isolated or floating.

Figure 3D:
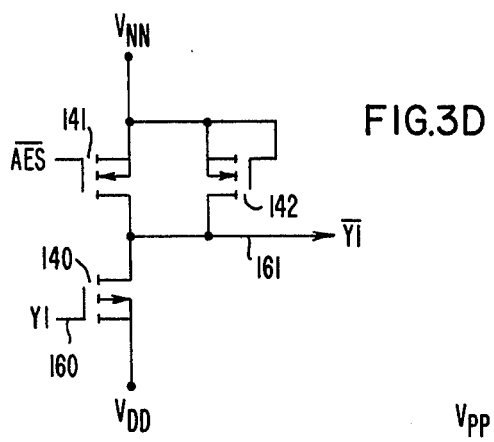
FIG. 3D is a circuit schematic of an inverter circuit for the column decoder.

An inverter circuit suitable for use in Y decoder 27 shown in FIG. 1 is shown in FIG. 3D. While Y decoder 27 may be implemented by a series of three transistors to form a tree decoder, a means for inverting the eight output signals of the tree decoder is needed. The tree decoder, for example, may be connected to voltage source $V_{pp}$ or $-18$ volts. The gates of the transistors in the tree decoder would be connected to address lines A5'–A7' and $\overline{A5'}$ through $\overline{A7'}$. The unselected column signals would remain high at $+12$ volts while the selected column signal would be at $-18$ volts. Referring to FIG. 3D the input signal such as Y1 on line 160 is coupled to the gate of transistor 140. The output signal which would represent $\overline{Y1}$ is coupled over line 161 to the drains of transistors 140, 141 and 142. When the input signal on line 160 is low or $-18$ volts, transistor 140 will be conducting and will pull line 161 to $+12$ volts. Transistor 142 will be drawing a small amount of current to $-8$ volts but will not be sufficient to pull down the voltage on line 161. Control signal $\overline{AES}$ will be $-18$ volts which will cause transistor 141 to be nonconducting. When the input signal on line 160 is high or $+12$ volts, transistor 140 will be in a non-conducting state and transistor 142 will pull line 161 down to $-8$ volts. In FIG. 3D, like references are used for functions corresponding to the apparatus of FIG. 3B.

Figure 3E:
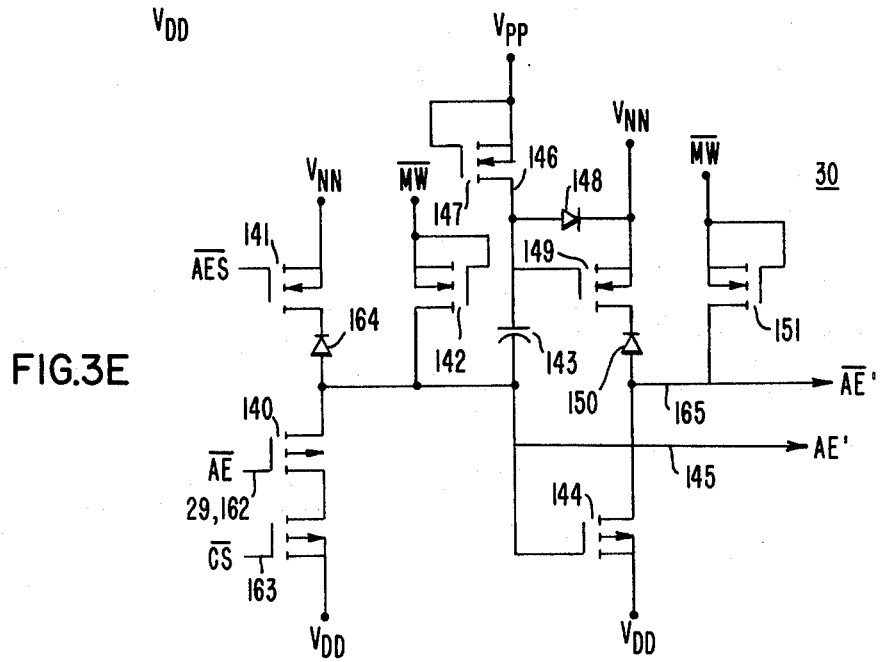
FIG. 3E is a circuit schematic of a buffer and level shift circuit used for the control signals and the address signals.

A circuit schematic of a buffer and level shift circuit suitable for use for control signals $\overline{AE}$ and W and for the address signals A0–A7 is shown in FIG. 3E. In FIG. 3E like references are used for the functions corresponding to the apparatus of FIG. 3B. The buffer and level shift circuit functions to accept an input signal of $+12$ volts or 0 volts and to provide an output signal of $+12$ volts and $-8$ volts or $-18$ volts when control signal $\overline{MW}$ is at $-18$ volts. Buffer and level shift circuit provides a non-inverting output $\overline{AE'}$ and an inverted output AE' when $\overline{AE}$ is the input signal on line 162. Line 162 is coupled to the gate of transistor 140 having its source coupled to the drain of transistor 163. The gate of transistor 163 is coupled to control signal $\overline{CS}$ and the source of transistor 163 is coupled to voltage supply $V_{DD}$. The drain of transistor 140 is coupled to the anode of diode 164, the drain of transistor 142, one side of capacitor 143 and the source of transistor 144 by means of line 145, which also functions as the output line for signal AE' which is a complement of the input signal on line 162. The cathode of diode 164 is coupled to the drain of transistor 141. The source and gate of transistor 142 are coupled to control signal $\overline{MW}$. The drain of transistor 144 is coupled over line 165 to the anode of diode 150 and the drain of transistor 151 and functions as an output line for signal $\overline{AE'}$. When signal $\overline{AE}$ and $\overline{CS}$ are 0 volts, transistors 140 and 163 will be conducting and line 145 will be charged to $+12$ volts from voltage supply $V_{DD}$. Transistor 144 will be non-conducting and transistor 149 will be conducting which will pull line 165 to $-8$ volts and if $\overline{MW}$ is at $-18$ volts transistor 151 will further pull line 165 to $-18$ volts. If either $\overline{AE}$ or $\overline{CS}$ are at $+12$ volts, then either transistor 140 or 163 will be non-conducting and transistor 142 will pull line 145 to $-8$ volts if $\overline{MW}$ is at $-8$ volts and if $\overline{MW}$ is at $-18$ volts then line 145 will be pulled to $-18$ volts through transistor 142. Transistor 144 will be conducting and line 165 will be charged to $+12$ volts through voltage supply $V_{DD}$. Transistor 149 will be non-conducting and transistor 151 will be drawing a small amount of current even though $\overline{MW}$ may be $-8$ volts or $-18$ volts. The current drawn by transistor 151 will be insufficient to pull line 165 below $+12$ volts which is pulled up by transistor 144. Therefore, level shifting will occur with the low state to $-18$ volts if MW is at $-18$ volts or to $-8$ volts if MW is $-8$ volts. The high state will be at 12 volts. Diode 164 functions to prevent current being drawn through transistor 141 when line 145 goes to $-18$ volts. The circuit described in FIG. 3E is readily applicable for signals A0–A7 and W to provide output signals A0'–A7', $\overline{A0'}$–$\overline{A7'}$, W' and $\overline{W'}$.

Figure 3F:
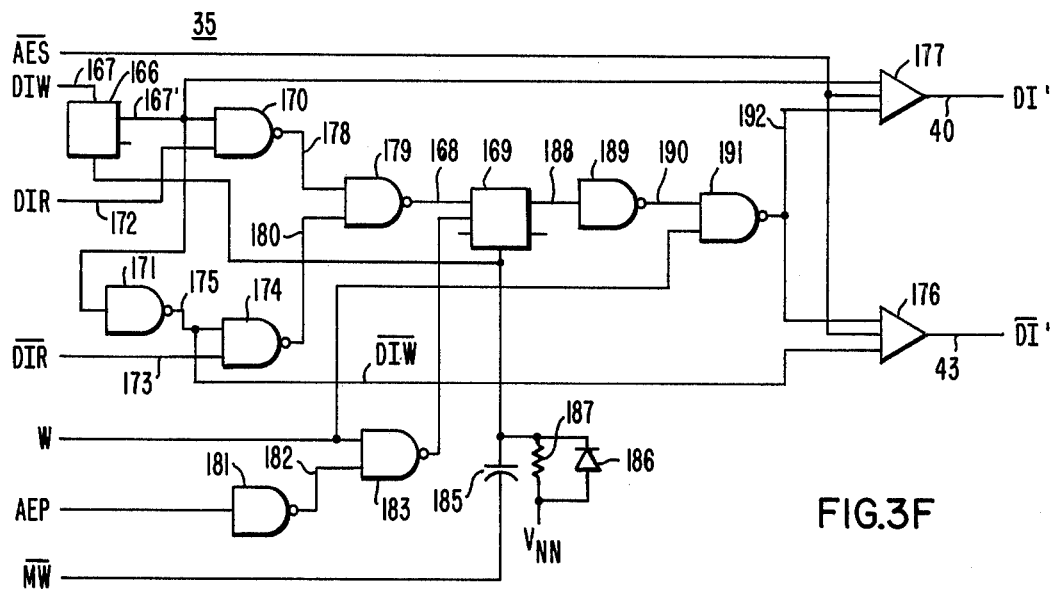
FIG. 3F is a circuit schematic for the write comparator.

FIG. 3F is a logic diagram for the WRITE comparator 35 shown in FIG. 2. WRITE comparator 35 functions to compare the WRITE data, signal DIW on line 167 to be written into a particular memory cell as determined by the address signals A0–A7 with the READ data, signal DIR and $\overline{DIR}$ from the addressed memory cell. If the binary state of the WRITE data, signal DIW is the same as the READ data DIR, then comparator 35 will generate an inhibit signal on line 168 which will be stored in flip-flop 169 to inhibit rewriting of the same data into the addressed memory cell. In particular, one method for inhibiting the rewrite of data is by clamping the data lines DI' and $\overline{DI'}$ to $+12$ volts which will prevent the necessary polarization voltages from occurring across the gate insulator of the memory transistors in the selected or addressed memory cell.

Referring to FIG. 3F, line 167 is coupled to an RS flip-flop 166 for holding the input write date, the output of flip-flop 166 is coupled over line 167 to an input of NAND gates 170 and 171. Signal DIR is coupled over line 172 to an input of NAND gate 170. Signal $\overline{DIR}$ is coupled over line 173 to an input of NAND gate 174. The output of NAND gate 171 is coupled over line 175 to an input of NAND gate 174 and an input of buffer circuit 176. The output of buffer 176 is coupled to line 43 and has the signal $\overline{DI'}$. Line 167' is coupled to an input of buffer circuit 177 which has an output coupled to line 40 and carries the signal DI'. The output of NAND gate 170 is coupled over line 178 to an input of NAND gate 179. The output of NAND gate 174 is coupled over line 180 to an input of NAND gate 179. The output of NAND gate 179 is coupled over line 168 to the data input of flip-flop 169. Control signal AEP is coupled to the input of NAND gate 181. The output of NAND gate 181 is coupled over line 182 to an input of NAND gate 183. Control signal W is coupled to a second input of NAND gate 183 and the output of NAND gate 183 is coupled over line 184 to the clock input of flip-flop 169. Control signal $\overline{MW}$ is coupled to one side of capacitor 185. The other side of capacitor 185 is coupled to the reset input of flip-flops 166 and 169, to the cathode of diode 186 and one side of resistor 187. The anode of diode 186 is coupled to the other side of resistor 187 and to voltage supply $V_{NN}$. The output of flip-flop 169 is coupled over line 188 to an input of NAND gate 189. The output of NAND gate 189 is coupled over line 190 to an input of NAND gate 191. Control signal W is coupled to a second input of NAND gate 191 and the output is coupled over line 192 to an input of buffer circuits 176 and 177. The output of buffer circuits 176 and 177 are $\overline{DI'}$ on line 43 and DI' on line 40.

In the operation of WRITE comparator 35, signals D1' and $\overline{D1'}$ are held to $+12$ volts during the READ cycle as shown in FIG. 4A and during WRITE cycle one of the signals may go to $-18$ volts as shown in FIG. 5A unless prevented by an inhibit signal stored in flip-flop 169. If the inhibit signal stored in flip-flop 169 is true or a binary 1, then the output signals D1' and $\overline{DI}'$ are held to +12 volts. During a READ cycle the data stored in an addressed memory cell is read out as DIR and $\overline{DIR}$. NAND gates 170 and 174 compare DIR and $\overline{DIR}$ to DIW and $\overline{DIW}$ respectively to determine if the WRITE data is in the same binary state as the READ data. DIW is held in flip-flop 166. If both inputs are a binary 1 to either NAND gate 170 or 174, the output of the respective NAND gate will go low, forcing the output of NAND gate 179 to the binary 1 state on line 168 which is an indication that the data signals do compare. If one of the inputs is high and the other low to either NAND gate 170 or 174, or if both the inputs are low, the output of the NAND gate will be high. If both inputs to NAND gate 179 are high, then the output 168 will be low, which is an indication that the data WRITE and data READ signals do not compare. At the end of the READ cycle when AEP goes to −8 volts from +12 volts at T5 and W goes from 0 to +12 volts, the voltage on line 184 will go low which will clock the data on line 168 into flip-flop 169, it being understood that flip-flop 169 is a J-K type flip-flop with a trailing edge clock. If the voltage on line 168 was high, then after the clock signal the output on line 188 will be high. If the voltage on line 168 was low, then after the clock signal to flip-flop 169 the output on line 188 will be low. If the voltage on line 188 is high, the output of NAND gate 189 will be low causing the output of NAND gate 191 to be high which will force the output data on lines 40 and 43 to +12 volts. A circuit suitable for buffer circuits 176 and 177 is shown in FIG. 3E where signal $\overline{AE}$ is replaced with $\overline{DIW}$ and $\overline{CS}$ is replaced with the output of NAND gate 191 on line 192 for buffer circuit 177. The output of the buffer circuit in FIG. 3E, $\overline{AE}'$ would then be DI' and coupled to line 40. For buffer circuit 176, $\overline{DIW}$ would replace $\overline{AE}$ and the output of NAND gate 191 on line 192 would replace $\overline{CS}$ to provide an output $\overline{DI}'$ with line 165 of the circuit in FIG. 3E coupled to line 43. If either DIW or the signal on line 192 or both are high, then the output signal DI' will be high or +12 volts. If either $\overline{DIW}$, the voltage on line 175 or the signal on line 192 or both are high, then the output of $\overline{DI}'$ will be high or +12 volts. If both DIW and the signal on line 192 is low, then $\overline{DI}$ will be low or −18 volts. If both $\overline{DIW}$, the signal on line 175 and the signal on line 192 are low, then the output of buffer cirucit 176 $\overline{DI}'$ will be low or −18 volts. At time T4 during the WRITE cycle as shown in FIG. 5A, signal $\overline{MW}$ goes from −18 volts to −8 volts which will cause positive current to flow through capacitor 185 and resistor 187 causing the voltage at the reset input of flip-flops 166 and 169 to go sufficiently positive to reset flip-flops 166 and 169 causing the voltage on lines 167' and 188 to go low, thus resetting flip-flops 166 and 169 for the next WRITE cycle. During the READ cycle, W goes from +12 volts to 0 volts at T2 as shown in FIG. 4A which causes the output of NAND gate 191 to be high on line 192 which in turn causes the outputs of buffer circuits 176 and 177 to be high or +12 volts. Thus, during the READ cycle D1' on line 40 and $\overline{DI}'$ on line 43 are held to +12 volts by control signal W.

Figure 4B:
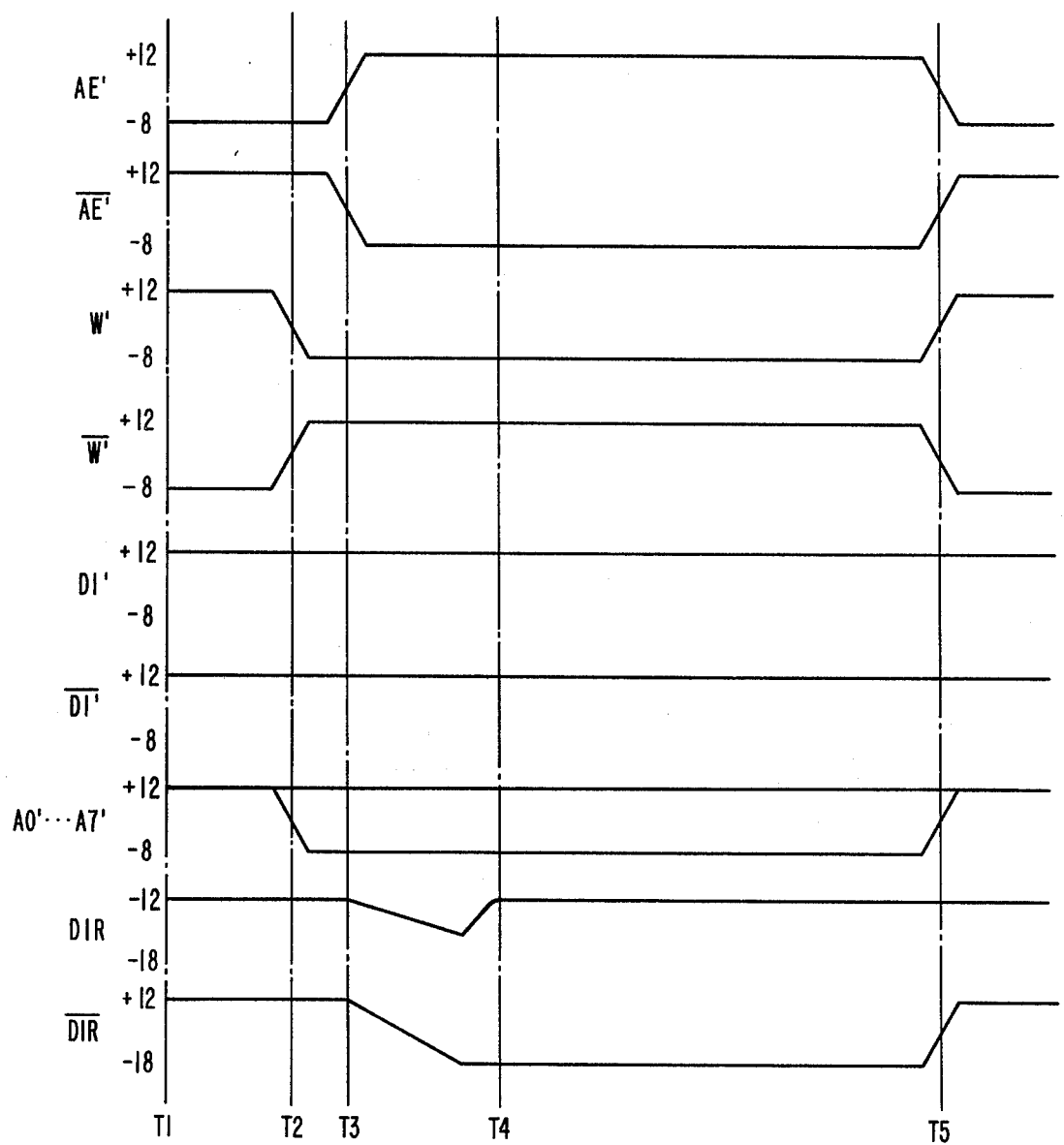

The READ operation of the memory shown in FIG. 2 may be understood by referring to FIGS. 3A, 4A and 4B. At time T1 as shown in FIG. 4A control signals $\overline{AES}$ and $\overline{CS}$ are at −8 volts and +12 volts respectively which holds the output signals of the row decoder buffer circuits at −8 volts. In addition, at T1 signals $\overline{AES}$ and $\overline{CS}$ hold $\overline{AE}'$ to +12 volts and AE' to −8 volts and W' to +12 volts and $\overline{W}'$ to −8 volts. At T1 $\overline{AES}$ also holds DI' and $\overline{DI}'$ to +12 volts in accordance with the circuit in FIG. 3F. Address lines A0-A7 may still be at the address of the last cycle or may be floating. A0'-A7' however will be at +12 volts due to the buffer circuit in combination with control signal $\overline{AES}$. At time T2 $\overline{AES}$ goes to −18 volts and $\overline{CS}$ goes to 0 volts which no longer forces the outputs of the buffer circuits. At time T2 W goes from +12 volts to 0 volts which causes W' to go from +12 volts to −8 volts and $\overline{W}'$ to go from −8 volts to +12 volts as shown in FIG. 4B. Signal W at 0 volts holds the output of NAND gate 191 high in FIG. 3F which holds signals DI' and $\overline{DI}'$ to +12 volts.

At time T2 the correct address should be on signal lines A0-A7 and signals A0'-A7' should be changing to the input address. Address bits A5-A7 will result in Y decoder 27 decoding the input address causing one of its eight output lines Y1-Y8 to go to −12 volts. In FIG. 4A Y1, for example, is shown going from +12 volts to −8 volts while Y8 is shown holding at +12 volts, since Y1 corresponded to the address signals, A5-A7. When signal Y1 goes to −8 volts at time T2, transistors 121 and 120 in column circuitry 115 and transistors 221 and 129 in column circuitry 116 shown in FIG. 3A will be in the conducting state. Transistors 120 and 129 will couple the column detector 32 to the memory cell in the selected column in memory array 17. The selected column, for example, if Y1 is low, is Y1L and Y1R which are the left and right side of a dual transistor memory cell. At time T2 AE' is at −8 volts which puts transistors 98, 99, 104, and 107 in the conducting state in row decoder 25 and transistors 298, 299, 304 and 307 in the conducting state in row decoder 26. Since $\overline{DI}'$ is at +12 volts, every line in the row decoder will be precharged to +12 volts since the buffer circuits in the row decoder will pass its input onto its output. $\overline{AE}'$ is at +12 volts which places transistor 86 in row decoder 25 and transistor 286 in row decoder 26 in the non-conducting state. The address lines and row decoders 25 and 26 have saddled and therefore one of the rows in the decode tree is decoded, but for the time being is at +12 volts. At time T2 with AE' at −8 volts transistors 125 and 119 in column circuitry 115 are in the conducting state, transistors 225 and 219 in column circuitry 116 are in the conducting state, transistors 325 and 319 in column circuitry 117 are in the conducting state and transistors 425 and 419 in column circuitry 118 are in the conducting state which couple DI' and $\overline{DI}'$ or +12 volts to every source and substrate body of the memory transistors in memory array 17. At time T2 W' is at −8 volts which turns transistor 84 of row decoder 25 and transistor 284 of row decoder 26 to the conducting state. $\overline{W}'$ is at +12 volts at time T2 which turns transistor 87 of row decoder 25 and transistor 287 of row decoder 26 to the non-conducting state. At time T2 control signal AEP is at −8 volts causing transistors 138 and 134 of column detector 32 to be in the conducting state and coupling voltage supply $V_{DD}$ to lines 123 and 131.

At time T3 control signal AEP goes from −8 volts to +12 volts which causes transistors 138 and 134 of column detector 32 to go in the non-conducting state. At time T3 signal AE' goes to +12 volts which places transistors 98, 99, 104, and 107 of decoder 25 and transistors 298, 299, 304 and 307 of decoder 26 in the non-conducting state. At time T3 AE' goes from +12 volts to −8 volts which causes transistor 86 of row decoder 25 and transistor 286 of row decoder 26 to go in the conducting state coupling voltage supply $V_{NN}$ through one of the rows in the decode tree through the buffer circuit to one of the rows in memory array 17 such as X1. When line 76 and line 77 go to −8 volts for the case when row X1 is selected, memory transistors 50 and 51 will be biased on to some degree depending upon the respective threshold voltage and lines 72 and 73 will conduct current through memory transistors 50 and 51 to −18 volts or voltage supply $V_{PP}$. Transistor 50 will draw current through transistor 120 and discharge the voltage on line 123. Transistor 51 will draw current through transistor 129 and will discharge the voltage on line 131. Due to the variation in conductivity of transistors 50 and 51 due to the transistor threshold voltage induced in the transistor, one transistor will conduct considerably more current than the other. The memory transistor and the low threshold state for holding a binary 1 with a typical threshold of −4 volts will conduct the most current. The memory transistor in the high threshold voltage state for holding a binary 0 with a typical threshold voltage of −7 volts will conduct the least amount of current. Column detector 32 comprised of cross-coupled transistors 133 and 136 will latch when the gate voltage of one of the transistors is low enough to turn the transistor towards the conductive state. The conducting transistor will help column detector 32 to latch due to the charging current from voltage supply $V_{DD}$ passing through the transistor charging or raising the voltage on the gate of the other transistor. As the gate voltage continues to lower on the other transistor, the latch will stabilize having, for example, an output voltage on line 23 of −18 volts and on line 131 of +12 volts. Time T4 represents when the data from column detector 32 signals DIR and $\overline{DIR}$ are valid as shown in FIG. 4B. At time T5 the READ cycle is over and the timing control signals are switched back to their initial values the voltage levels at time T1. The internal signals within the memory also are biased to their voltage levels originally at T1 by action of the buffer circuits which are controlled by the timing signals after T5 to hold the output voltages at predetermined voltages.

To write data into the memory as shown in FIG. 2 and FIG. 3A, a read cycle is first performed to determine the present data in the memory cell. The data read out of the addressed memory cell, DIR and $\overline{DIR}$, its complement, is compared with the data to be written DIW in write comparator 35. If the write data compares with the read data, the actual writing of data or rewriting of data into the memory cell is inhibited by preventing the polarization voltages from occurring across the gate insulator. One method of preventing the polarization voltages from occurring across the gate insulator is shown in FIG. 3F wherein the inhibit signal will hold the data signals DI' and $\overline{DI}'$ to +12 volts during the write cycle from T1 to T4. If the read data does not compare with the write data, then the write data will be present on DI' and its complement will be $\overline{DI}'$ as shown in FIG. 5A at time T2. At time T2 $\overline{MW}$ goes from −8 volts to −18 volts which shifts the signals coming out of the buffer circuits from −8 volts to −18 volts if they are in the low state to provide an additional 10 volts to assist in applying a polarization voltage to the selected memory cell. For example, the low state of the data, such as DI' as shown in FIG. 5, is at −18 volts while the high state of DI' is +12 volts. Between times T2 and T3 $\overline{AE}'$ is −18 volts and AE' is at +12 volts. Transistors 98, 99, 104 and 107 of row decoder 25 are in the conducting state and charge the row lines in row decoder 25 to the voltage of $\overline{DI}'$ which, for this example, is +12 volts, as shown in FIG. 5A. Buffers 95, 97, 105 and 108 of row decoder 25 charge the row lines in memory array 17, lines X1 through X32 to +12 volts. Transistors 298, 299, 304 and 307 of row decoder 26 are in the conducting state and charge the row lines in row decoder 26 to the voltage of signal DI', which for this example, is −18 volts, as shown in FIG. 5A. Buffers 295, 297, 305 and 308 charge lines X1 through X32 in memory array 17, such as lines 77, 79, 81 and 83 to −18 volts. Transistors 125 and 119 of column circuitry 115 are in the conducting state and charge the substrate body of the memory transistors connected to line 68 and the source of the memory transistors connected to line 72 to the voltage of $\overline{DI}'$ or +12 volts. Transistors 225 and 219 of column circuitry 116 are in the conducting state and charge line 70 which is connected to the substrate body of the memory transistors in this column and the line 73 which is connected to the source of the memory transistors in its column to the voltage of signal DI' or −18 volts. The drains of all the memory transistors in memory 17 are connected to voltage source $V_{pp}$ or −18 volts. Column circuitry 117 charges lines 74 and 69 to +12 volts in the same manner as column circuitry 115. Column circuitry 118 charges lines 71 and 75 to −18 volts in the same manner as column circuitry 116 charges lines 70 and 73. Between times T2 and T3, as shown in FIGS. 5A and 5B, the address lines A0 to A7 and A0' through A7' have settled on the address for the memory cell to be written. W and W' are at +12 volts, which holds transistors 84 and 284 in the non-conducting state. $\overline{W}'$ is at −18 volts, which turns transistors 87 and 287 to the conducting state. The voltage of signal DI' or −18 volts is allowed to pass through transistor 87, but is not allowed to pass through transistor 86 since signal $\overline{AE}'$ is at +12 volts. The signal $\overline{DI}'$ or +12 volts is allowed to pass through transistor 287, but is not allowed to pass through transistor 286 because signal $\overline{AE}'$ is at +12 volts. From time T2 through T4 Y decoder 27 has decoded the address bits A5 through A7 and provides an output signal on one of the column select lines Y1 through Y8 and pulls it to −18 volts. FIG. 5A shows Y1 as the selected line. With Y1 at −18 volts, transistors 121 and 120 of column circuitry 115 and transistors 221 and 129 of column circuitry 116 are turned to the conducting state. Y1 is at +12 volts, which turns transistors 126 and 226 off. Y8 is at +12 volts, which turns transistors 321, 124, 421 and 130 off or in a nonconducting state. $\overline{Y8}$ is −18 volts, which turns transistors 326 and 426 to the conducting state. At time T3 signal AE' goes from −18 volts to +12 volts and its complement $\overline{AE}'$ goes from +12 volts to −18 volts as shown in FIG. 5B. Transistor 86 of row decoder 25 and transistor 286 of row decoder 26 are turned on and allow −18 volts to pass through transistor 86 through the address tree decoder through the decoded row buffer to the row line in memory array 17, such as X1, which will charge X1 to −18 volts. +12 volts will pass through transistor 286 through the address decoder in selected row buffer to the selected row in memory array 17, such as X1, line 77, and will charge it to +12 volts. Transistor 50 of the addressed memory cell will have a voltage across the memory gate insulator $V_i$ of −30 volts.

Figure 6:
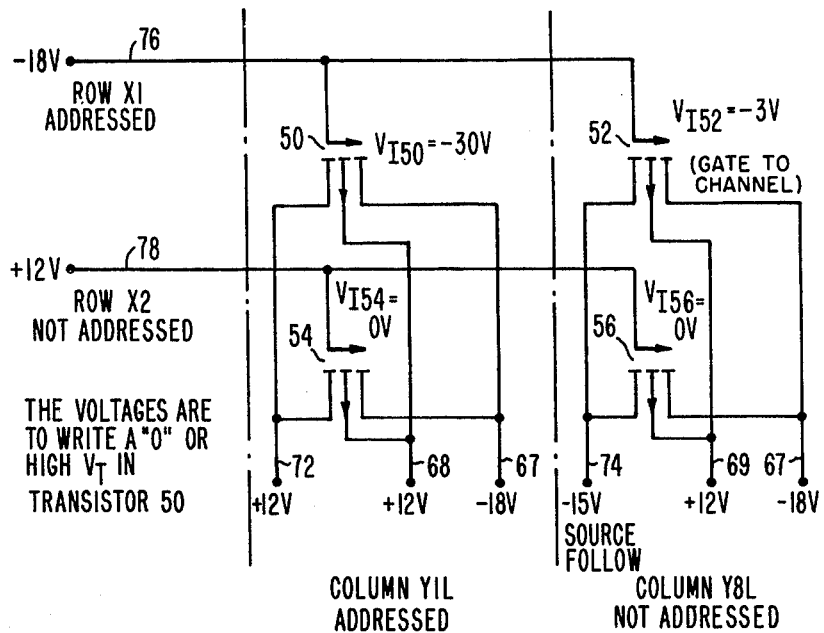
FIG. 6 shows the voltages on adjacent memory transistors when writing a high threshold state or binary zero into a memory transistor.
Figure 7:
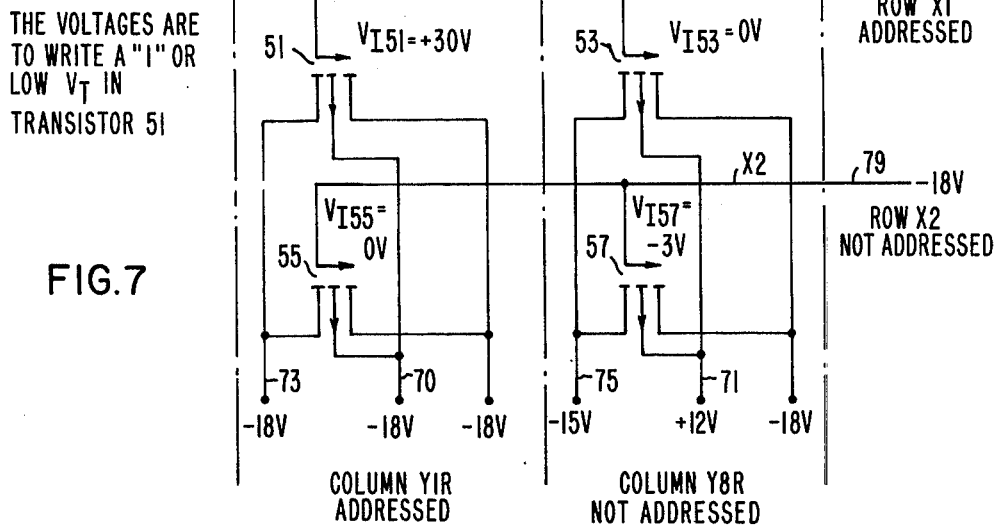
FIG. 7 shows the voltages on adjacent memory transistors when writing a low threshold state or binary one into a memory transistor.

FIG. 6 shows the voltages on memory transistor 50 and adjacent memory transistors when writing a zero or high threshold voltage into memory transistor 50. Transistor 51 of the addressed memory cell has a voltage across the memory gate insulator $V_i$ equal to +30 volts. FIG. 7 shows the voltages on the memory transistor 51 and on adjacent memory transistors when writing a low voltage threshold or binary 1 into memory transistor 51. At time T4 as shown in FIGS. 5A and 5B, the control signals return to their initial voltage at time T1, ending the write cycle. It is understood to one skilled in the art that the thresholds of the two transistors in the memory cell may be reversed on a subsequent write cycle by reversing the voltages of DI' from −18 volts to +12 volts and on $\overline{DI}'$ from +12 volts to −18 volts.

The invention provides a method and apparatus for storing information comprising first and second variable threshold field effect transistors, first means for varying a threshold voltage of the first variable threshold transistor, second means for varying the threshold voltage of the second variable threshold transistor concomitantly with the first means, wherein the first means includes means for increasing the threshold voltage and the second means includes means for reducing the threshold voltage. The present invention further provides a method for writing data into a semiconductor memory utilizing variable threshold transistors comprising the steps of holding the input data to be written into a memory cell, reading the data presently stored in the memory cell to be written, comparing the input write data with the read data to generate a first signal indicative of data being the same and a second signal indicative of data being different, inhibiting the write cycle in response to the first signal and writing the data into the memory cell in response to the second signal. Alternately, the first and second signals may be one signal line having a first and second binary state or logic level.

I claim:

1. A method for writing data into a semiconductor memory cell utilizing at least first and second variable threshold transistors comprising the steps of:
   holding the input data to be written into a memory cell;
   reading the data presently stored in said memory cell to provide read data;
   comparing said input data with said read data to generate a first signal indicative of said input and read data being the same and a second signal indicative of said input and read data being different;
   inhibiting the write cycle polarization voltages in response to said first signal; and
   writing said input data into said memory cell in response to said second signal.

2. The method of claim 1 wherein said step of inhibiting the write cycle polarization voltages includes the step of clamping the write data signal coupled to said memory cell to a predetermined voltage.

3. A method for writing data into a semiconductor memory cell utilizing at least first and second variable threshold transistors each having a gate, source, drain and substrate body comprising the steps of:
   holding the input data to be written into a memory cell;
   reading the data presently stored in said memory cell to provide read data;
   comparing said input data with said read data to generate a first signal indicative of said input and read data being the same and a second signal indicative of said input and read data being different;
   inhibiting the write cycle polarization voltages in response to said first signal; and
   writing said input data into said memory cell in response to said second signal wherein said step of writing includes the steps of:
   applying a first voltage to the gate of said first transistor and to the substrate body and source of said second transistor in response to the binary level of said input data; and
   concomitantly applying a second voltage to the substrate body and source of said first transistor and to the gate of said second transistor in response to the complement binary level of said input data.

4. A semiconductor memory cell for storing information comprising:
   first and second variable threshold field effect transistors;
   first means for varying the threshold voltage of said first variable threshold transistor;
   second means for varying the threshold voltage of said second variable threshold transistor concomitantly with said first means;
   said first means including means for increasing the threshold voltage; and
   said second means including means for reducing the threshold voltage.

5. The semiconductor memory cell of claim 4 wherein said first means includes:
   a first row decoder circuit coupled to the gate of said first transistor, and
   a first column decoder circuit coupled to the source and substrate body of said first transistor.

6. The semiconductor memory cell of claim 5 wherein said second means includes:
   a second row decoder circuit coupled to the gate of said second transistor, and
   a second column decoder circuit coupled to the source and substrate body of said second transistor.

7. The semiconductor memory cell of claim 4 wherein said first variable threshold field effect transistor has a gate insulator comprised of a layer of silicon nitride and a layer of silicon dioxide.

8. A semiconductor memory for storing information comprising:
   a plurality of memory cells arranged in a matrix having a plurality of rows and a plurality of columns;
   said memory cells including at least first and second variable threshold transistors;
   first and second row decoders coupled to each of said memory cells for selecting the same memory cell at one time and applying different voltages to said memory cell when writing;
   means for writing information into a selected memory cell by varying the threshold voltage of at least two of said plurality of transistors; and
   means for reading information from a selected memory cell by comparing the conductivities of at least two of said plurality of transistors.

9. A semiconductor memory having a plurality of memory cells, each utilizing at least first and second variable threshold transistors, for storing information comprising:
   means for holding input data to be written into a memory cell;
   means for reading the data presently stored in said memory cell to provide read data;
   means for comparing said input data with said read data to generate a first signal indicative of said input and read data being the same and a second signal indicative of said input and read data being different;
   means for inhibiting the write cycle polarization voltages in response to said first signal; and
   means for writing said input data into said memory cell in response to said second signal.

* * * * *